(12) United States Patent
Caille et al.

(10) Patent No.: US 6,222,493 B1
(45) Date of Patent: Apr. 24, 2001

(54) DEVICE FOR TRANSMITTING AND RECEIVING MICROWAVES SUBJECTED TO CIRCULAR POLARIZATION

(75) Inventors: Gérard Caille, Tournefeuille; Michel Gomez-Henry, Toulouse, both of (FR)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/462,516
(22) PCT Filed: May 10, 1999
(86) PCT No.: PCT/FR99/01104
§ 371 Date: Jan. 10, 2000
§ 102(e) Date: Jan. 10, 2000
(87) PCT Pub. No.: WO99/60661
PCT Pub. Date: Nov. 25, 1999

(30) Foreign Application Priority Data

May 15, 1998 (FR) .................................................. 98 06200

(51) Int. Cl.⁷ ..................................................... H01Q 1/42
(52) U.S. Cl. ................... 343/789; 343/700 MS; 343/756
(58) Field of Search .............................. 343/700 MS, 756, 343/771, 789, 829, 846, 909, DIG. 2; H01Q 1/38, 1/42

(56) References Cited

U.S. PATENT DOCUMENTS

| 4,403,221 | 9/1983 | Lamberg et al. . |
| 5,043,738 | * 8/1991 | Shapiro et al. ............... 343/700 MS |
| 5,233,364 | * 8/1993 | Lefeuvre et al. ..................... 343/789 |
| 5,241,321 | * 8/1993 | Tsao ............................... 343/700 MS |
| 5,434,581 | 7/1995 | Raguenet et al. . |
| 5,497,164 | 3/1996 | Croq . |
| 6,054,953 | * 4/2000 | Lindmark ...................... 343/700 MS |

FOREIGN PATENT DOCUMENTS 0 886 336 A2    12/1998 (EP) .

OTHER PUBLICATIONS

Patent Abstracts of Japan, vol. 098, No. 005, Apr. 30, 1998 corresponding to JP 10 022728 A (Toyo Commun Equip Co., Ltd) dated Jan. 23, 1998.
Patent Abstracts of Japan, vol. 018, No. 447 (E–1594) Aug. 19, 1994 corresponding to JP 06 140835 A (Toshiba Corp) dated May 20, 1994.
Patent Abstracts of Japan, vol. 018, No. 390 (E–1582), Jul. 21, 1994 corresponding to JP 06 112724 A (Toshiba Corp) dated Apr. 22, 1994.

* cited by examiner

*Primary Examiner*—Tho Phan
(74) *Attorney, Agent, or Firm*—Sughrue, Mion, Zinn, Macpeak & Seas, PLLC

(57) ABSTRACT

The invention relates to a device for transmitting and receiving microwaves including a planar radiating element. The device is characterized in that the radiating element (60) has substantially orthogonal transmit and receive ports (68, 66) and the relative phase of the transmit and receive signals and the shape of the radiating element are such that the transmit and receive signals, whose frequencies are different, are circularly polarized in opposite directions.

17 Claims, 6 Drawing Sheets

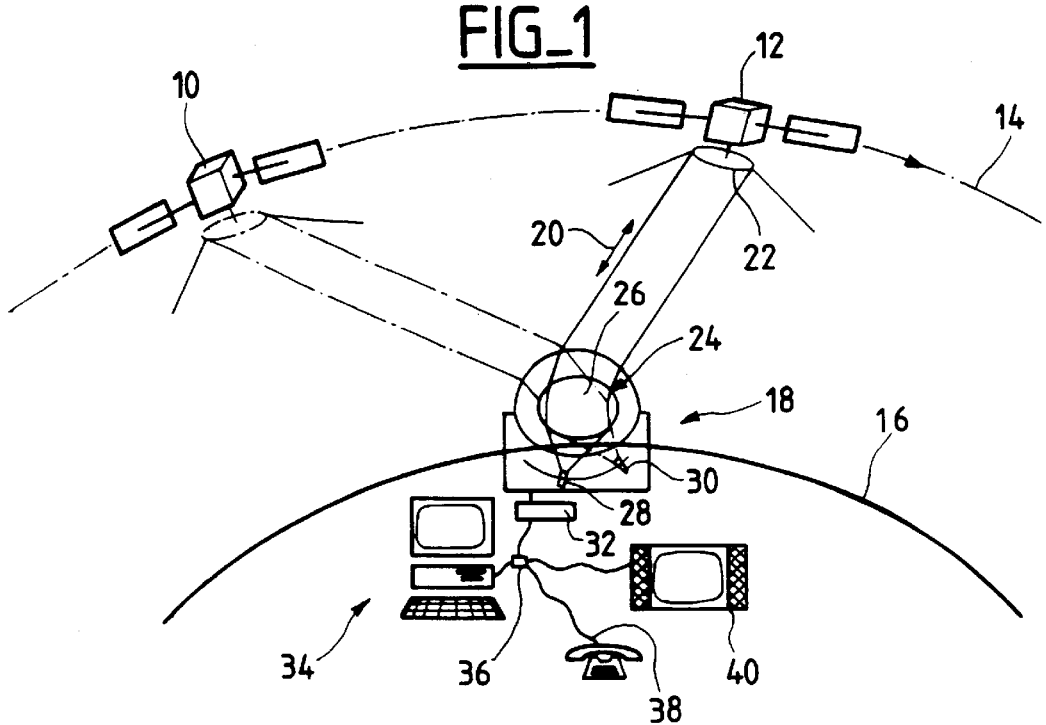
FIG_1
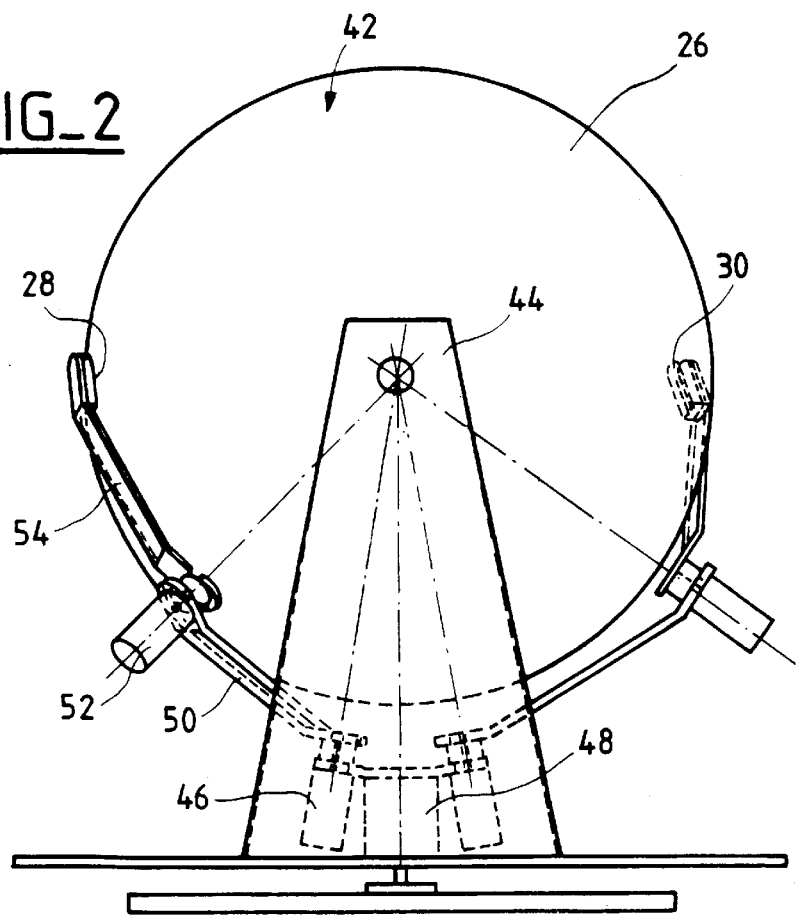
FIG_2

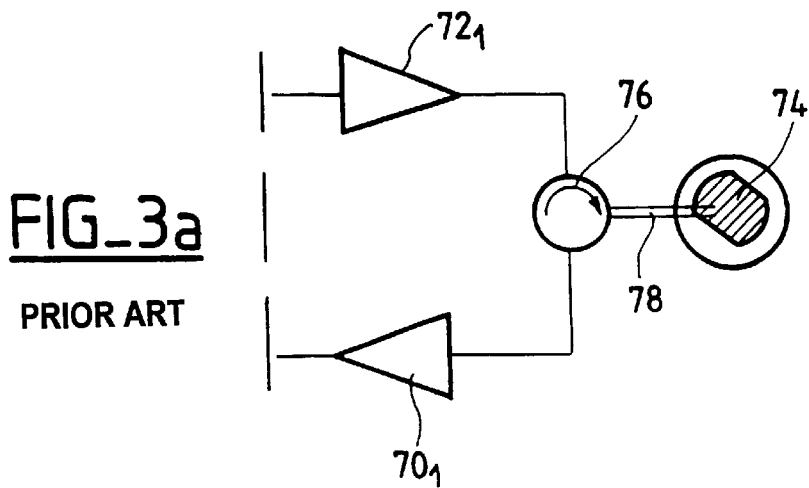
FIG_3a
PRIOR ART
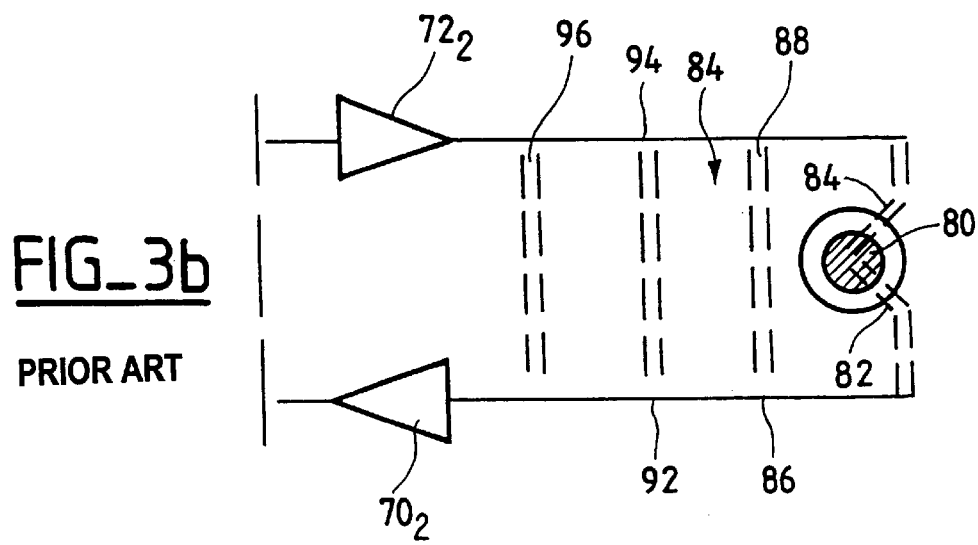
FIG_3b
PRIOR ART
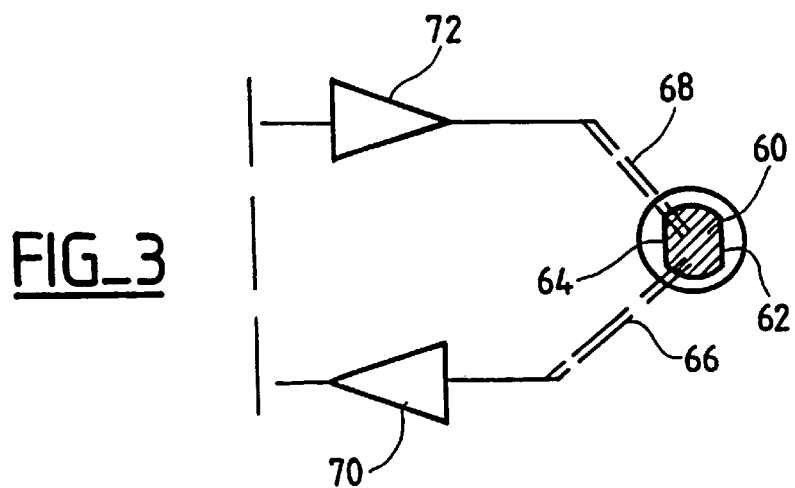
FIG_3

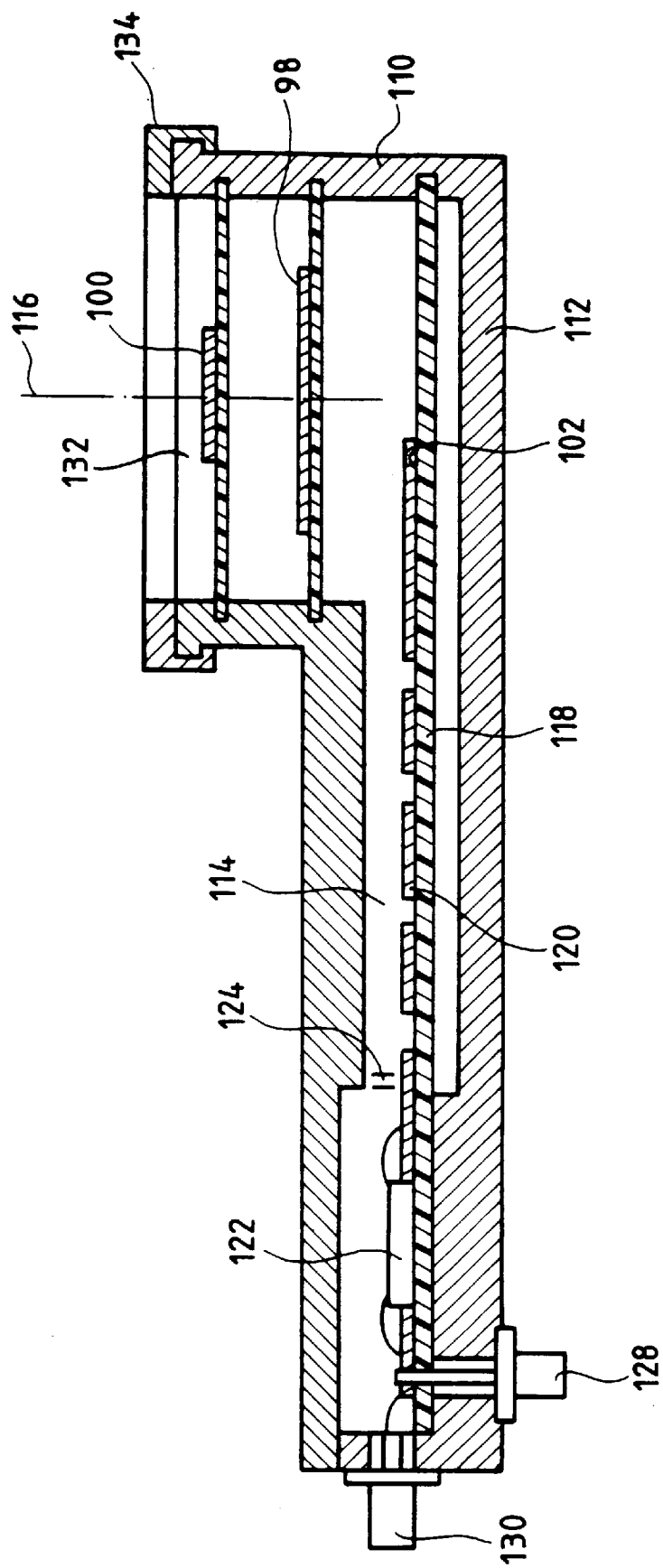
FIG_4

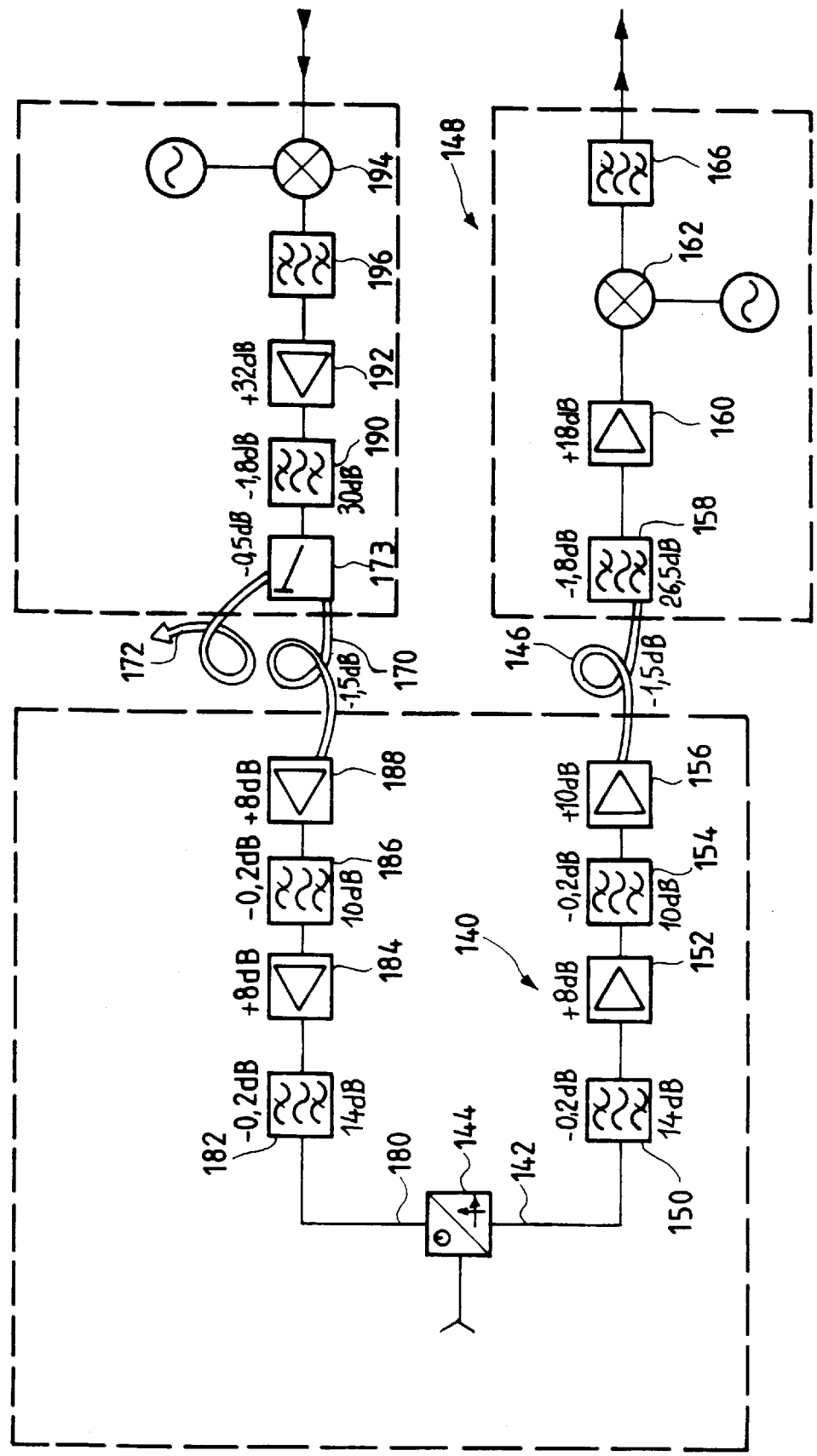
FIG_5

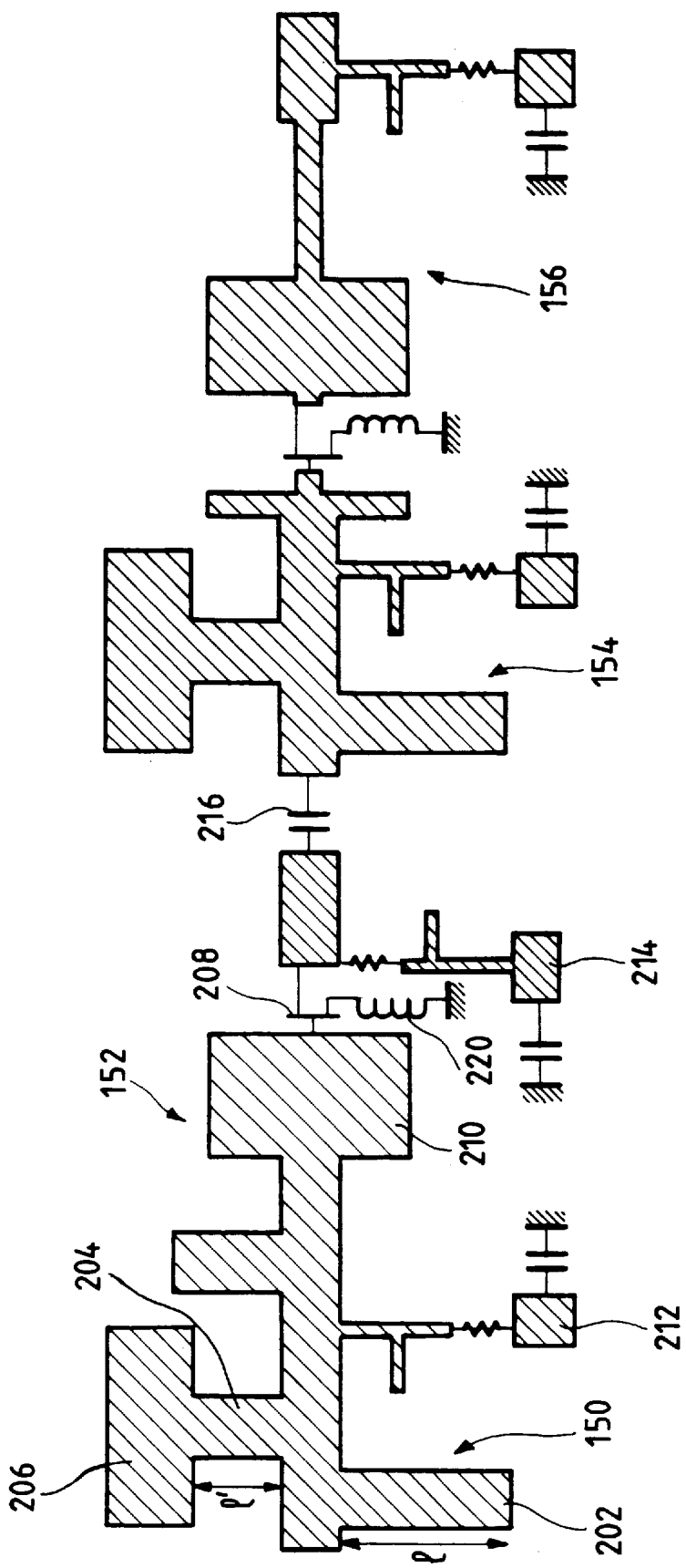
FIG_6

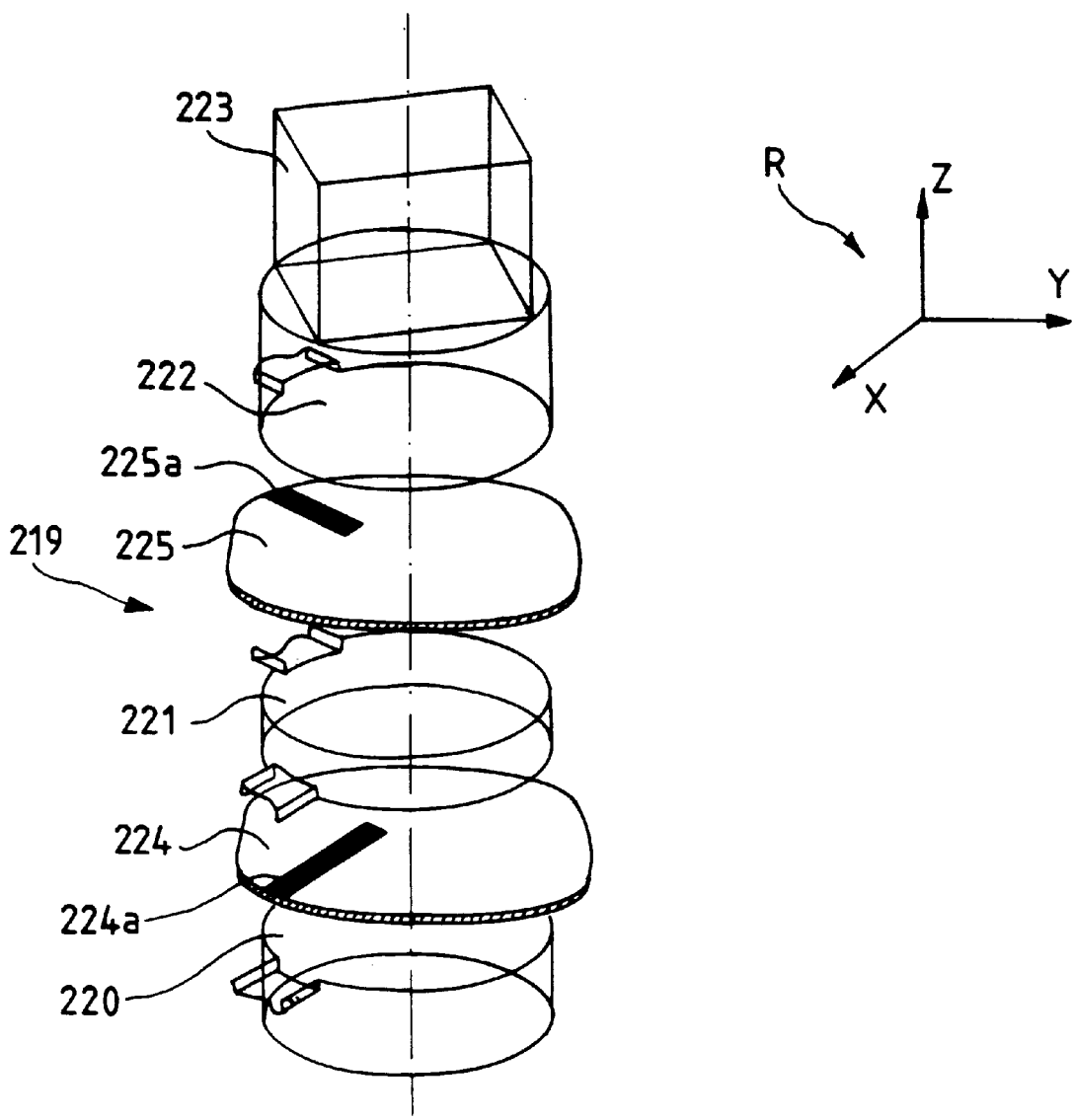
FIG_7

DEVICE FOR TRANSMITTING AND RECEIVING MICROWAVES SUBJECTED TO CIRCULAR POLARIZATION

BACKGROUND OF THE INVENTION

The invention relates to a device for transmitting and receiving circularly polarized microwaves.

Devices of this kind are routinely used in telecommunications systems. They are usually intended to transmit high powers and receive low powers. This applies to telecommunications systems in which the signals are relayed by geostationary satellites, for example.

In such devices, the transmit frequencies and the receive frequencies are different to prevent the transmit signals interfering with the receive signals. It is also necessary to provide filter means so that the required frequency can be received or transmitted on each channel and the frequency of the other channel eliminated. The signals must be particularly carefully separated when transmission and reception are simultaneous.

Such systems usually include a waveguide source and a duplexer with a high rejectivity in the transmit and receive bands, respectively. They are therefore bulky, which may not be suitable in all applications, in particular in telecommunications systems terminals in which each user must be provided with a transceiver.

In particular, microwave transceiver devices are routinely used for domestic and professional applications in satellite telecommunications systems.

Telecommunications systems of this type are being developed for "multimedia" applications, for example. Such systems include a constellation of satellites in low Earth orbit, at an altitude of 800 km to 1500 km, or medium Earth orbit, at an altitude of 6000 km to 12,000 km. These orbits are "low" and "medium" in comparison with the orbit of geostationary satellites at an altitude of 36,000 km. The role of the satellites is to provide communications between terrestrial users. The calls transmitted in this way are multimedia calls, i.e. they convey TV, audio and video signals, digital data of all kinds, programs, telephone signals or facsimile signals. Compared to calls relayed by geostationary satellites, the low altitude of the satellites reduces the distance the call has to travel and therefore the propagation time delays, which facilitates interactivity in such systems. Furthermore, with constellations of satellites it is possible to optimize the coverage, for example by concentrating resources in areas of high population density, whereas a geostationary orbit concentrates resources in areas near the equator.

A terrestrial user can communicate with a satellite only when the satellite is "in view"; this is generally for a period in the order of twenty minutes. It is therefore necessary for the user's antenna to be able to track the satellite as it moves overhead and for the user to be able to switch the call instantaneously to the next satellite, which is coming into their field of view at the same time as the present satellite is moving out of their field of view. Instantaneous switching is needed above all for interactive calls for which any interruption of service, however short, is unthinkable. To solve this problem, a transceiver device with two antennas is generally provided, one antenna moving to track the satellite with which the user is communicating and the other at the ready and pointing towards the beginning of the field of view of the next satellite.

Transceiver devices, and in particular their antennas, intended for such telecommunications systems must be particularly light and small in order to facilitate movement and installation on the roof of a building (in particular a private house) and thereby avoid an undesirable aesthetic effect.

Furthermore, it can be advantageous to associate the two transceiver devices with a common focusing lens. In this case, the two devices must coexist in a limited space, which reinforces the need for these devices to be small in size and light in weight.

Given the above conditions, it is hardly feasible to use a waveguide/duplexer configuration with a high rejectivity, which is heavy and bulky. A more compact technology is therefore used, that most widely employed being referred to as the "microstrip" technology. However, with this technology, solutions known in the art to the problem of isolating transmission and reception cause high losses which degrade link quality or make it necessary to increase the size of the antenna.

For example, document JP 10 022728 describes a circular polarization antenna using a technology of the above kind and used only to transmit or only to receive, and therefore for a single frequency band. Consequently, a transceiver device would have to comprise two antennas of the above type with a hybrid coupler because the same type of polarization is used for both frequency bands.

Document JP 06 140835 concerns a circular polarization antenna including a patch for transmitting and a patch for receiving. There is therefore one port for each frequency band, which means that the antenna is oversized.

SUMMARY OF THE INVENTION

The invention provides a transceiver device that is particularly compact and enables simultaneous transmission and reception, minimum interference in the received signal due to the transmitted signal, and low-loss transmission and reception with a low noise factor, i.e. with a high signal to noise ratio.

The transceiver device of the invention is characterized in that the transmit and receive signals are circularly polarized in opposite directions and the antenna of the device includes a radiating element with two orthogonal ports or lines, namely one transmit port and one receive port.

In a first embodiment of the invention the radiating element is a compact element comprising a stack made up of:

a short-circuit cavity, an intermediate cavity, a matching cavity, and a rectangular polarizing waveguide section, and the short-circuit, intermediate and matching cavities enable adjustment of the matching of the ports to the required frequency bands, one port is formed between the short-circuit cavity and the intermediate cavity and the other port is formed between the intermediate cavity and the matching cavity.

In a second embodiment of the invention the radiating element includes at least one planar patch.

To obtain circular polarizations in opposite directions the patch is circular, but with deformations, for example cut-away edges.

Because the transmit and receive signals are orthogonally polarized, there is already some degree of isolation between transmission and reception, in the order 20 dB.

What is more, the technology employed, with a non-circular planar element and perpendicular ports, minimizes the overall size and weight of the antenna. In particular, the number of elements of the device is minimized because it is not necessary to provide either a circulator, which would prevent the use of two opposite polarizations, or a 90° hybrid coupler which converts the orthogonal linear polarizations into circular polarizations in opposite directions.

Minimizing the number of components helps to minimize the cost of the device.

Because the transmit and receive frequency bands are separate, the radiating element must be able to operate over a relatively wide band comprising the two bands used. To optimize this wideband operation, in one embodiment of the invention two superposed planar radiating elements with different dimensions are used, one resonating at a frequency in to the transmit band and the other resonating at a frequency in the receive band.

The two radiating elements are placed in a cavity, for example, which optimizes the directional properties of the radiating element. This is because the cavity prevents rearward and sideward radiation and limits the radiation to a wanted cone directed towards the transmit and receive source with which the device is communicating, in particular a non-geostationary satellite, as explained above.

When two superposed radiating elements are provided, it is possible either to provide the ports on one of those elements, preferably the lower one, or to provide ports without contact with either of the two elements. In this case, the ports are preferably under the bottom radiating element.

BRIEF DESCRIPTION OF THE DRAWING

Other features and advantages of the invention will become apparent from the description of some embodiments of the invention given with reference to the accompanying drawings, in which:

FIG. 1 is a diagram showing the use of a transceiver device in accordance with the invention in a non-geostationary satellite telecommunications system, FIG. 2 is a diagram showing an antenna comprising two transceiver devices of the invention and used in a satellite telecommunications system, FIG. 3 is a diagram of part of a transceiver device of the invention, FIGS. 3a and 3b are diagrams analogous to that of FIG. 3 showing prior art variants, FIG. 4 is a sectional diagram showing a transceiver device of the invention, FIG. 5 is a diagram showing transceiver circuits of the device of the invention, FIG. 6 shows one embodiment of receiver circuits, and FIG. 7 is an exploded perspective view of another embodiment of the compact radiating element.

DETAILED DESCRIPTION OF THE INVENTION

In the telecommunications system shown in FIG. 1, a set of satellites 10, 12 occupies an orbit 14 at an altitude of approximately 1,000 km to 1,500 km above the surface 16 of the Earth. Each satellite includes transceiver means for relaying a call between terrestrial users and stations providing access to specific services, such as databases. FIG. 1 therefore shows a user terminal 18 which sets up an interactive call with another user or an Earth station (not shown) via the satellite 12. The interactive nature of the call is symbolized by a double-headed arrow 20 on the path of the electromagnetic waves between the antenna 22 of the satellite 12 and the antenna 24 of the user 18.

The antenna 24 is on the roof of a private house, for example. It has a focusing, for example spherical, surface 26, as shown in FIG. 2, and two radiating elements 28 and 30 which can move over the focal surface 26 of the antenna 24.

The radiating element 28 tracks the satellite 12 which is currently in view and the radiating element 30 is in a waiting position and continues to point towards the area in which the next satellite will appear. The radiating element 30 takes over from the element 28 when the satellite 12 leaves the field of view of the antenna and the next satellite enters it. The switching from the element 28 to the element 30 can be instantaneous.

In the example shown in FIG. 1, a control unit 32 on the premises of the user 18 tracks the satellites, controls the transmission and reception of signals and possibly decrypts the signals. The control unit is connected to a microcomputer 34 or the like including memory which stores information relating to the positions of the satellites so that the motors can be caused at any time to move the radiating elements 28 and 30 to point them accurately towards the satellites.

If a microcomputer is used, it can also receive or transmit programs.

In this multimedia application example, a telephone or facsimile line 38 and a TV or radio receiver 40 are also connected via a connector or distributor 36.

FIG. 2 shows a more detailed example of an antenna 24 with radiating elements 28 and 30. In this embodiment, a fixed lens 42 receives microwave radiation within a solid angle of sufficient size to collect signals from non-geostationary satellites in the user's field of view. The lens focuses received radiation onto a spherical surface over which the radiating elements 28 and 30 move. The lens 42 is supported by two uprights of which only one upright 44 can be seen in FIG. 2.

The radiating elements 28 and 30 can move over the spherical focusing surface 26. Two motors and two arms are provided for each element for this purpose. For simplicity, only the motors and arms for the radiating element 28 are described.

The radiating element 28 is moved by a first motor 46 fastened to a bottom support 48 and whose output shaft rotates an arm 50 at the end of which is a second motor 52 in turn driving a forearm 54 at the end of which is the radiating element 28. The motors 46 and 52 for moving the radiating element 28 are controlled by information supplied by the microcomputer 34 or the like.

Each radiating element 28, 30 is associated with a transceiver circuit described later with reference to FIG. 5.

Because the terminals 18 are consumer products, it is essential that they are small in size, low in weight and of minimum cost. The need for low weight and small size is reinforced by the fact that the transceiver devices are mobile and are associated within a small volume, i.e. that of the antenna 24.

This minimal size, weight and price must be compatible with the high performance necessitated in particular by the high bit rate of the information and simultaneous transmission and reception. From this point of view, isolating transmit and receive signals is a difficult problem, especially in the above-mentioned context of small size and low cost.

In the present example, the receive band Rx is from 11.7 GHz to 12.45 GHz (and can be extended up to 12.55 GHz) and the transmit band Tx is from 14 GHz to 14.3 GHz. The transmit power is a few watts, in the order of 2 W to 3 W.

The radiating element of the invention is of the compact type and has substantially orthogonal transmit and receive ports, the relative phase of the transmit and receive signals and the shape of the radiating element being such that the transmit and receive signals, whose frequencies are different, are circularly polarized in opposite directions.

In a first embodiment of the invention (FIG. 7), the radiating element comprises the following stacked elements:
- a short-circuit cavity 220,
- an intermediate cavity 221,
- a matching cavity 222, and
- a rectangular polarizing waveguide section 223.

The short circuit, intermediate and matching cavities adjust the matching of the ports to the required frequency bands.

To this end, one port 224 is provided between the short-circuit cavity and the intermediate cavity and the other port 225 is between the intermediate cavity and the matching cavity.

Broadly speaking, the operation of the device is as follows:

The single-band and dual-band aspects are managed by the short-circuit, intermediate and matching cavities.

The radiative interface consisting of the rectangular polarizing waveguide section 223 enables propagation of orthogonal TE01 and TE10 modes in the required bands. Because of the rectangular cross-section, the group velocity of the TE01 and TE10 modes differs slightly, enabling a slight phase difference to be obtained between the two modes. Phase quadrature between the two modes is obtained when the conditions at the limits of the rectangular section 223 and its length (approximately $\lambda_g/4$) are adequate: the antenna generates the circular polarization.

The orthogonal relationship of the ports 224 and 225 provides isolation between ports and the superposed excitation of two pairs of TE01 and TE10 modes with opposite quadrature conditions for each pair enabling double circular polarization to be obtained.

The cavity formed by the rectangular section 223 and the port part, on the one hand, and the radiative part, on the other hand, enables a phase quadrature relationship to be obtained between the TE01 and TE10 modes over wide bandwidths.

The stack comprising the short-circuit cavity 220, the intermediate cavity 221 and the matching cavity 222 constitutes a cavity which is shown as circular in FIG. 7. The cavity can instead be substantially square with its sides substantially perpendicular to the excitation lines 224*a* and 225*a* which constitute the respective ports 224 and 225 and consequently are inclined at approximately 45° to the rectangular section 223.

The technology shown in FIG. 7 for the ports 224 and 225 corresponds to a triplate solution, but other solutions can be chosen according to the application, for example:
- a coaxial solution,
- a microstrip solution, possibly inverted relative to the axis Z of the antenna system of axes R,
- slot or iris coupling with a waveguide for the bottom port 224,
- a waveguide solution for applications beyond the Ku band, and
- a hybrid solution such that each port 224, 225 is implemented using one of the above solutions.

To assure electrical contact between the various cavities aligned along the Z axis, the etches can be double-sided with plated-through holes. This latter solution is justified in particular for applications in frequency bands above 6 GHz (band C).

In a second embodiment of the invention, the radiating element is of the planar type and comprises a patch 60 (FIG. 3) in the shape of a circle truncated by parallel lines 62 and 64. The patch 60 is associated with two microstrip line ports 66 and 68 at an angle of 90° to each other. The two ports 66 and 68 are excited by signals with a relative phase difference of 90°. The port 66 is a receive port and is therefore connected in particular to a low-noise amplifier 70. The port 68 is a transmit port and is therefore connected in particular to a power amplifier 72.

Exciting the ports 66 and 68 with signals having a relative phase difference of 90° produces transmit and receive signals which are circularly polarized in opposite directions. In conjunction with the separate frequency bands of the signals, the orthogonal polarizations of the transmit and receive signals produce around 20 dB of isolation between the signals. The planar technology used for the radiating element minimizes its cost, size and weight. Furthermore, the implementation with two direct ports minimizes the number of components and eliminates the need for the wideband hybrid coupler or circulator corresponding to the prior art as shown in FIG. 3*a* (circulator) and FIG. 3*b* (hybrid coupler).

In the known example of the prior art shown in FIG. 3*a*, a truncated circular plane patch 74 has a port connected to the output of the power amplifier $72_1$ (transmit circuit) via a circulator 76. The port 78 is also connected to the receive channel, i.e. to a low-noise amplifier $70_1$, via the same circulator 76.

In the FIG. 3*b* example, a non-truncated circular planar radiating element 80 has two orthogonal ports 82 and 84 connected to respective terminals 86 and 88 of a hybrid coupler 90 having two other terminals 92 and 94. The terminal 92 is connected to the input of the low-noise amplifier $70_2$ and the terminal 94 is connected to the output of the power amplifier $72_2$; In manner that is well known in the art, the 90° hybrid coupler converts orthogonal linear polarizations at the terminals 92 and 94 into circular polarizations in opposite directions at the terminals 86 and 88, in a manner that is well known in the art. Accordingly, the signals at the ports 82 and 84 have circular polarizations in opposite directions. The hybrid coupler 90 is preferably of the wideband type. To this end, one or more additional microstrip branches 96 are provided, also in a manner that is well known in the art.

One embodiment of the transceiver device using a planar patch that is preferable for use in the FIG. 3 embodiment will now be described with reference to FIG. 4.

In this example there are two superposed planar patches 98 and 100. The shape of each patch corresponds to that shown in FIG. 3, i.e. a truncated circle. The dimensions of the patches are different, however. The bottom patch 98 has dimensions corresponding to resonance in the receive band and the top patch has smaller dimensions corresponding to resonance in the transmit band (higher frequencies).

The two patches have a relative arrangement such that they have a common central axis (perpendicular to their plane) with their truncation lines parallel.

The ports 102 are under the bottom patch 98. Only one port can be seen in FIG. 4. The ports use the microstrip or suspended triplate technology. They are connected to the filter circuits and to the low-noise or power amplifiers by microstrip or triplate lines. In this example the filter and matching means also use the microstrip or triplate technology.

The patches and the ports are disposed in a cylindrical cavity 110 open at the top and having a bottom 112.

The cavity 110 limits a relatively narrow microwave transmit and receive cone directed towards the satellite 12.

The bottom of the cavity is connected to a channel 114 whose axis is perpendicular to the axis 116 of the central cavity 110. The channel contains a substrate 118 carrying the ports 102 and microstrip or triplate filter and matching circuits 120. The substrate also has active components such as amplifier transistors 122 at the opposite end of the channel 114 to the cavity 110. A sealing wall 124 separates the end part of the planar microstrip technology channel 114 including the transistors 122 from the circuits 120, which are preferably implemented in the suspended triplate planar technology.

The end of the channel 114 comprises a receive signal terminal 128 and a transmit signal terminal 130.

The opening 132 at the top of the cavity 110 is closed by a protective cap 134 made from a plastic material such as PTFE or ABS.

Alternatively (not shown), the ports are on one of the patches, for example the patch 98.

It is equally possible to provide a single patch with ports on the patch or at a distance from it.

Another disposition relating to filtering and amplification which minimizes noise, in particular that generated by filtering, whilst reducing the cost of implementing the circuits will now be described with reference to FIG. 5. Losses are also minimized.

Because transmission and reception are simultaneous, filtering out transmit frequencies in the receive circuits and receive frequencies in the transmit circuits must be particularly efficient.

To this end, each circuit includes planar filters and multistage amplification and filtering. The attenuation, or rejectivity, of the filter nearest the radiating element is a fraction of the attenuation needed to eliminate the frequencies to be eliminated. In one example, the total rejectivity needed to eliminate the transmit (or receive) frequencies is in the order of 50 dB and the rejectivity of the first (or last) stage filter is only in the order of 14 dB. This value is calculated as a function of the compression point of the first receive (amplifier) transistor (or the noise factor of the last transmit (amplifier) transistor), the power to be transmitted or the isolation between the two ports of the source (radiating element).

The amplification provided by the first stage of amplification is preferably that which can be obtained with a low-noise transistor.

This minimizes the noise seen by the radiating element. This is because this noise depends mostly on the noise due to the amplification stage and the filter nearest the element. In contrast, the noise introduced at the radiating element by amplifier and filter stages that are farther away is reduced in proportion to the gain of the intermediate amplifier stages between the radiating element and the filter generating the noise.

What is more, planar filters having a moderate rejectivity can be easily implemented at moderate cost because low-cost substrates can be used. Planar microstrip (or suspended triplate) technology filters for high rejectivities require relatively costly alumina substrates, but for lower rejectivities it is possible to use lower cost substrates, for example substrates based on PTFE (see below).

In the example shown in FIG. 5, the receive circuit comprises a first part 140 between the port 142 of the patch 144 of the radiating element and an end of a cable 146. It has a second part 148 between the other end of the cable 146 and the demodulator (not shown) of the receive circuit.

The port 142 is connected directly to the input of a first filter 150 of the band-pass type for receive frequencies and of the band-stop type for transmit frequencies. For transmit frequencies it has a moderate rejectivity (14 dB). For receive frequencies its attenuation (or loss) is low, in the order of 0.2 dB. The first filter 150 is connected to the input of a first amplifier stage 152 which in this example comprises a single transistor. The amplifier 152 has a gain of 8 dB in this example. Note that this gain of 8 dB is not the maximum gain that could be obtained with one transistor. However, in this example, noise is minimized to the slight detriment of the gain, as explained below with reference to FIG. 6.

The first part 140 of the receive circuit also includes a second stage filter-amplifier pair comprising a filter 154 whose input is connected to the first amplifier 152 and a second amplifier 156 which also comprises a single transistor in this example. The filter 154 has a rejectivity of 10 dB for transmit frequencies and a low rejectivity (0.2 dB) for receive frequencies. The amplifier stage 156 has a gain of 10 dB.

In this example the level of the unwanted transmit signal at the output of the stage 156 is below 10 dBm.

The cable 146, which introduces an attenuation of 1.5 dB in this example, is connected to the filter and amplifier second part 148 which comprises a third filter-amplifier pair 158–160. The filter 158 receives the signal supplied by the cable 146 and delivers a signal to the third amplifier 160. The attenuation of the filter 158 is 26.5 dB for transmit frequencies and 1.8 dB for receive frequencies. The amplifier stage 160 includes two transistors and its gain is 18 dB.

All unwanted transmit signals have been filtered out from the signal obtained at the output of the stage 160, which is conventionally connected to a mixer 162 receiving a 10.75 GHz local oscillator signal at another input. The output of the mixer 162 is connected to the receive demodulator via a low-pass filter 166.

The attenuation of unwanted frequencies by each filter is matched to the gain of the associated amplifier so that it is sufficient to prevent unwanted transmit signals delinearizing or saturating the transistor(s) of the amplifier (this is referred to as compression). Each filter must therefore be upstream of the associated amplifier, i.e. the filter must be nearer the radiating element than the amplifier of the same pair.

The overall noise factor of the receive circuit is essentially that of the first stage (filter 150 and amplifier 152).

In this embodiment the coaxial cable 146 and the corresponding coaxial cables 170 and 172 for the transmit circuit form a loop around the motors which can be reeled in or paid out as the arms move.

The second part 148 of the receive circuit (and the corresponding part of the transmit circuit) are at the bottom of the antenna in this example, i.e. near the base 48 (FIG. 2).

The first part 142 of the receive circuit is implemented in the "hybrid without adjustment" technology, which means that active components such as transistors are deposited directly onto a substrate, with no packaging, and that the substrate has planar, for example photo-etched, conductors. This implementation minimizes the noise factor, i.e. it maximizes the signal to noise ratio. The weight and overall size are also minimized.

In contrast, the part of the circuit 148 which is at the bottom of the antenna, and which is therefore farther away from the radiating element, can be made more conventionally using an integrated technology such as the MMIC (Microwave Monolithic Integrated Circuit) technology. As already indicated, the noise introduced by the stage 148 makes little contribution to the overall noise factor.

Similarly, the losses of the filter 158 with the higher rejectivity (26.5 dB in this example), which avoids compression, i.e. delinearizing the transistors of the stage 160, is also less critical than for the part 140.

In the part 140, the substrates are Rogers Corporation RO 3006 or RO 4003 substrates, for example. They comprise a matrix of flexible organic material such as PTFE (polytetrafluoroethylene) reinforced with glass microfibers and charged with ceramic particles which increase the dielectric constant and therefore reduce the size of the circuits. One side of the substrate is coated with a copper layer which constitutes the earth and the other side is covered with copper which is photo-etched to form the circuits.

The transmit circuit is analogous to the receive circuit. The transmit port 180 of the patch 144 is connected to the output of a first filter 182 whose input is connected to the output of an amplifier stage 184. The attenuation of the filter 182 is 14 dB for receive frequencies and 0.2 dB for transmit frequencies. The gain of the amplifier 184 is 8 dB.

The input of the amplifier 184 is connected to an output of a filter 186 receiving the output signal of an amplifier stage 188. The attenuation of the filter 186 is 10 dB for receive frequencies and 0.2 dB for transmit frequencies. The gain of the amplifier stage 188 is 8 dB.

The other part of the transmit circuit is also at the bottom of the antenna, near the base 48 (FIG. 2), and includes a filter 190 connected to the cable 170 or 172 via a switch 173. The filter 190 receives the output signal of an amplifier stage 192 including four transistors. The attenuation of the filter 190 is 30 dB for receive frequencies and 1.8 dB for transmit frequencies. The gain of the amplifier 192 is 32 dB.

The input of the amplifier 192 is connected to the output of a mixer 194 via a filter 196. The mixer has two inputs which are conventionally connected to a transmit modulator (not shown) and a 13.05 GHz transmit local oscillator.

For the transmit circuit, the advantage of the division into stages is that the last stage, connected directly to the port 180, has low losses because of the low rejectivity of the filter 182 and the relatively low gain of the stage 184.

The cable 172 is connected to the circuits associated with the second radiating element (not shown). In other words, the part of the transmit circuit with the switch 173, filter 190, amplifier 192, filter 196 and mixer 194 is common to the two radiating elements. The other parts of the circuit are individual to each radiating element.

FIG. 6 shows a particularly simple and efficient embodiment of the first part 140 of the receive circuit. The first part (182, 184, 186, 188) of the transmit circuit can be implemented in an analogous manner; it is therefore not described in detail.

The filters 150 and 154 are an important feature of this embodiment.

These filters must have low-loss band-pass characteristics for receive frequencies and high attenuation band-stop characteristics for transmit frequencies.

Each filter comprises at least one etched planar conductive member which is transverse to the current propagation etch 200 in this example. Thus the filter 150 has an elongate rectangular first etch 202 perpendicular to the etch 200 and terminating in a standard open circuit. The filter 150 also has a second etch 204 or stub branching from the line 200. The stub 204 terminates in a "pseudo short circuit" simulated by a wide capacitative section 206. This avoids a connection to earth via plated-through holes.

The stub 202 terminating in an open circuit must have a length l such that there is an open circuit where it joins the main line 200 for transmit frequencies and a short circuit for receive frequencies.

The length l must be a multiple of $\lambda/2$ for wavelengths $\lambda$ corresponding to receive frequencies and a multiple of $\lambda/4$ for wavelengths corresponding to transmit frequencies.

To achieve this objective, the length l is made equal to $\lambda_d/4$, where $\lambda_d$ is a wavelength corresponding to a frequency $f_d$ equal to the difference $f_t - f_r$ between two frequencies $f_t$ and $f_r$, $f_t$ is a frequency in the transmit band and $f_r$ is a frequency in the receive band. The frequencies $f_d$, $f_t$ and $f_r$ are also chosen to satisfy the following equations:

$$f_t = (2m+1)f_d$$
$$f_r = 2mf_d$$

In the above equations, m is a positive integer.

The length l is therefore a multiple of $\lambda/4$ for transmit frequencies and a multiple of $\lambda/2$ for receive frequencies. Under these conditions, the element 202 constitutes a short circuit for receive frequencies and an open circuit for transmit frequencies.

The stub 204 terminated by the wide capacitative section 206 simulating a short circuit at the junction 204–206 must have a length l' chosen so that the element constitutes a short circuit for transmit frequencies and an open circuit for receive frequencies. A length l' of $\lambda_d/4$ is chosen where $\lambda_d$ corresponds to a frequency $f_d = f_t - f_r$ and where:

$$F_t = 2mf_d$$
$$F_r = (2m-1)f_d$$

All the embodiments achieve the required result, namely high attenuation of transmit frequencies and transmission of receive frequencies without interference.

In the example for which the Rx band is from 11.7 GHz to 12.45 GHz and the Tx band from 14 GHz to 14.3 GHz, and in the case of the stub 204 terminated by a pseudo short circuit, the frequencies $f_r$, $f_t$ and $f_d$ can be chosen as follows:

$f_r = 11.75$ GHz
$f_t = 14.1$ GHz
$f_d = f_t - f_r = 2.35$ GHZ
$f_r = 5f_d$
$f_t = 6f_d$

For the element 202 terminating in an open circuit, the frequencies $f_r$, $f_t$ and $f_d$ are chosen so that $f_r$ is an even multiple of $f_d$ and $f_t$ is an odd multiple of $f_d$.

Note that the filter element 202 can be used on its own without the filter element 204–206 or the filter element 204–206 can be used on its own without the element 202 or, finally, as shown, the two filter elements can be used simultaneously.

The amplifier stage 152 includes a transistor 208 and electrode polarization and impedance matching etches. In this example, the transistor 208 is a Fujitsu FHX13X. Its gate is connected to the line 200 via a rectangular etch 210. The bias is applied to a square etch 212 for the gate and a square etch 214 for the drain.

The stage 152 is connected to the filter stage 154 via a capacitor 216 for matching and decoupling the bias voltages at the terminals 212 and 214.

The source of the transistor 208 is connected to earth via an inductor 220 providing feedback and consisting of a wiring or connection strip or wire. The inductance of the inductor 220 is optimized to minimize noise. Minimizing the noise can reduce the gain, but this effect is slight and does not degrade amplification performance.

What is claimed is:

1. A device configured to simultaneously transmit and receive microwaves including a radiating element, wherein the radiating element (60; 219) has substantially orthogonal transmit and receive ports (68, 66; 224, 225), wherein the relative phase of the transmit and receive signals and a shape of the radiating element are such that the transmit and receive signals are circularly polarized in opposite directions, and wherein a frequency of the transmit signals is different from a frequency of the receive signals.

2. A device according to claim 1, wherein the radiating element is a compact element (219) comprising a stack made of:
- a short-circuit cavity (220),
- an intermediate cavity (221),
- a matching cavity (222), and
- a rectangular polarizing waveguide section (223), and wherein the short-circuit, intermediate and matching cavities enable adjustment of the matching of the ports to the required frequency bands, one port (224) is formed between the short-circuit cavity and the intermediate cavity and the other port (225) is formed between the intermediate cavity and the matching cavity.

3. A device according to claim 1, wherein the radiating element (60) includes at least one planar patch.

4. A device according to claim 3, wherein the patch (60) is circular with deformations (62, 64).

5. A device according to claim 4, wherein the deformations are in the form of cutaway edges (62, 64).

6. A device according to claim 5, wherein the cutaway edges are parallel.

7. A device according to claim 4, wherein the radiating element includes two superposed patches (98, 100).

8. A device according to claim 7, wherein the two superposed patches are disposed in a cavity (110).

9. A device according to claim 8, wherein the cavity is extended by a channel (114) carrying planar port circuits.

10. A device according to claim 7, wherein the dimensions of the patches are different, one patch (100) resonates at transmit frequencies and the other patch (98) resonates at receive frequencies.

11. A device according to claim 7, wherein the ports (102) are at a distance from the bottom patch (98).

12. A device according to claim 3, wherein the ports are in contact with a patch.

13. A device according to claim 1, wherein the transmit port (68; 180) is connected directly to the output of a circuit for amplifying and filtering transmit signals and wherein the receive port (66; 142) is connected directly to the input of a circuit for filtering and amplifing receive signals.

14. A device according to claim 1, wherein the transmit frequencies are in the band from 14 GHz to 14.3 GHz and the receive frequencies are in the band from 11.7 GHz to 12.45 GHz or 12.55 GHz.

15. A device for transmitting and receiving microwaves for a non-geostationary satellite telecommunications system, comprising two transceiver devices according to claim 1, which transceiver devices are associated with a common focal surface (26) receiving signals from satellites of the satellite telecommunications system.

16. A device according to claim 15, further comprising drive means so that each transceiver device can track the movement of a satellite.

17. A compact radiating element for a device capable of simultaneously transmitting first microwave signals in a first frequency band and receiving second microwave signals in a second frequency band different from the first frequency band, comprising:
- a transmitting port for transmitting the first microwave signals;
- a receiving port arranged substantially orthogonal to the transmitting port for receiving the second microwave signals;
- a short-circuit cavity;
- an intermediate cavity;
- a matching cavity; and
- a rectangular polarizing waveguide section, wherein one of the ports is arranged between the short-circuit cavity and the intermediate cavity, wherein the other one of the ports is arranged between the intermediate cavity and the matching cavity, and wherein the first microwave signals and the second microwave signals are circularly polarized in opposite directions.

* * * * *